(12) United States Patent
Saida et al.

(10) Patent No.: US 12,082,449 B2
(45) Date of Patent: Sep. 3, 2024

(54) DISPLAY DEVICE

(71) Applicant: SHARP KABUSHIKI KAISHA, Sakai (JP)

(72) Inventors: Shinsuke Saida, Sakai (JP); Shinji Ichikawa, Sakai (JP); Ryosuke Gunji, Sakai (JP); Tohru Okabe, Sakai (JP); Akira Inoue, Yonago (JP); Yoshihiro Nakada, Yonago (JP); Hiroharu Jinmura, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 412 days.

(21) Appl. No.: 17/442,564

(22) PCT Filed: Mar. 29, 2019

(86) PCT No.: PCT/JP2019/014126
§ 371 (c)(1),
(2) Date: Sep. 23, 2021

(87) PCT Pub. No.: WO2020/202293
PCT Pub. Date: Oct. 8, 2020

(65) Prior Publication Data
US 2022/0130929 A1    Apr. 28, 2022

(51) Int. Cl.
*H10K 59/124* (2023.01)
*H10K 50/822* (2023.01)
(Continued)

(52) U.S. Cl.
CPC ......... *H10K 59/124* (2023.02); *H10K 50/822* (2023.02); *H10K 59/122* (2023.02); *H10K 77/10* (2023.02)

(58) Field of Classification Search
CPC .. H10K 59/124; H10K 50/822; H10K 59/122; H10K 77/10; H10K 59/131; H10K 59/80521; H10K 50/00; H10K 50/10; H10K 50/11; H10K 50/125; H10K 50/13; H10K 50/131; H10K 50/14; H10K 50/15; H10K 50/157; H10K 50/16; H10K 50/17; H10K 50/30; H10K 65/00; H10K 10/10; H10K 19/00; H10K 30/00; H10K 39/00; H10K 59/00; H10K 71/00; H10K 77/00;
(Continued)

(56) References Cited

U.S. PATENT DOCUMENTS

2007/0188093 A1   8/2007  Nagara et al.
2017/0031323 A1*  2/2017  Kim .................... H10K 59/1213

FOREIGN PATENT DOCUMENTS

JP    2007-250520 A    9/2007

* cited by examiner

*Primary Examiner* — Mohammad A Rahman
(74) *Attorney, Agent, or Firm* — ScienBiziP, P.C.

(57) ABSTRACT

A separation wall is provided in a frame shape along a circumferential edge of a through-hole in a non-display region, in which the through-hole is formed, defined in an island shape inside a display region. The separation wall includes a wall base portion provided in a frame shape by a part of a second interlayer insulating film and a resin layer provided in an eave shape on the wall base portion to extend to a through-hole side and a display region side. Opening portions opening upward are provided on peripheries of the wall base portion on the through-hole side and the display region side in the second interlayer insulating film.

18 Claims, 19 Drawing Sheets

(51) Int. Cl.
*H10K 59/122* (2023.01)
*H10K 77/10* (2023.01)

(58) Field of Classification Search
CPC .... H10K 85/00; H10K 99/10; H10K 2101/00;
H10K 2102/00; G09F 9/30; H05B 33/02;
H05B 33/04; H01L 27/32; H01L 51/50
See application file for complete search history.

DISPLAY DEVICE

TECHNICAL FIELD

The disclosure relates to a display device.

BACKGROUND ART

In recent years, a self-luminous type organic electroluminescence (hereinafter also referred to as EL) display device using an organic EL element has attracted attention as a display device that can replace liquid crystal display devices. Here, for example, the organic EL element includes an organic EL layer including a light-emitting layer, a first electrode disposed on one surface side of the organic EL layer, and a second electrode disposed on the other surface side of the organic EL layer.

For example, PTL 1 discloses an organic electroluminescence display panel in which an organic EL layer and a second electrode formed using a vapor deposition method are divided by a partition wall having a reverse tapered portion.

CITATION LIST

Patent Literature

PTL 1: JP 2007-250520 A

SUMMARY

Technical Problem

In an organic EL display device, for example, to dispose a camera, a fingerprint sensor, and the like inside a display region for which an image is displayed, it is necessary to provide an island-shaped non-display region and provide through-holes extending through in a thickness direction in the non-display region. However, a common function layer formed using a vapor deposition method is disposed in the display region, and thus, when the through-holes described above are provided inside the display region, there is concern that moisture and the like may flow into the display region through the common function layer exposed from the through-holes. In such a case, an organic EL layer constituting the organic EL element deteriorates, and thus it is necessary to form the common function layer separated into a display region side and a through-hole side on the periphery of the through-holes. It is technically difficult to manufacture a vapor deposition mask such that a common function layer is not formed in the through-holes inside the display region and on the periphery thereof. Here, while it is effective to use a reverse tapered structure described in PTL 1 to form the common function layer separated into the display region side and the through-hole side, a negative photosensitive material is necessary for the reverse tapered structure, and the manufacturing cost becomes high, which leaves room for improvement.

The disclosure has been made in view of such points, and an object thereof is to form a common function layer separated into a display region side and a through-hole side at low cost.

Solution to Problem

In order to achieve the object described above, a display device according to the disclosure includes: a base substrate in which a display region for which image display is performed, a frame region disposed on the periphery of the display region, and a non-display region having an island shape inside the display region are defined; a thin film transistor layer including a first interlayer insulating film and a second interlayer insulating film that are disposed on the base substrate and are sequentially stacked; a light-emitting element layer disposed on the thin film transistor layer and in which a plurality of light-emitting elements are arranged in correspondence with a plurality of subpixels configuring the display region; and a sealing film disposed on the light-emitting element layer and including at least one layer of a sealing insulating film, a first electrode, a function layer, and a second electrode being sequentially stacked in each of the light-emitting elements, and a through-hole extending through the base substrate in a thickness direction of the base substrate being formed in the non-display region, in which, a separation wall is provided in a frame shape along a circumferential edge of the through-hole in the non-display region, the separation wall includes a wall base portion provided in a frame shape by a part of the second interlayer insulating film and a resin layer provided in an eave shape on the wall base portion to protrude toward a through-hole side and a display region side, opening portions opening upward are provided on peripheries of the wall base portion on the through-hole side and the display region side in the second interlayer insulating film, the function layer includes a common function layer that is disposed to be common to the plurality of subpixels, and the common function layer is disposed on the resin layer to extend from the display region to the through-hole and is cut apart below circumferential ends of the resin layer on the through-hole side and the display region side.

Advantageous Effects

According to the disclosure, a separation wall includes a wall base portion provided in a frame shape by a part of a second interlayer insulating film and a resin layer provided in an eave shape on the wall base portion to extend to a through-hole side and a display region side, and opening portions opening upward are provided on peripheries of the wall base portion on the through-hole side and the display region side in the second interlayer insulating film. Therefore, a common function layer can be formed while being separated into the display region side and the through-hole side at low cost.

DESCRIPTION OF EMBODIMENTS

Embodiments of the disclosure will be described below in detail with reference to the drawings. Note that the disclosure is not limited to each embodiment to be described below.

First Embodiment

Figure 1:
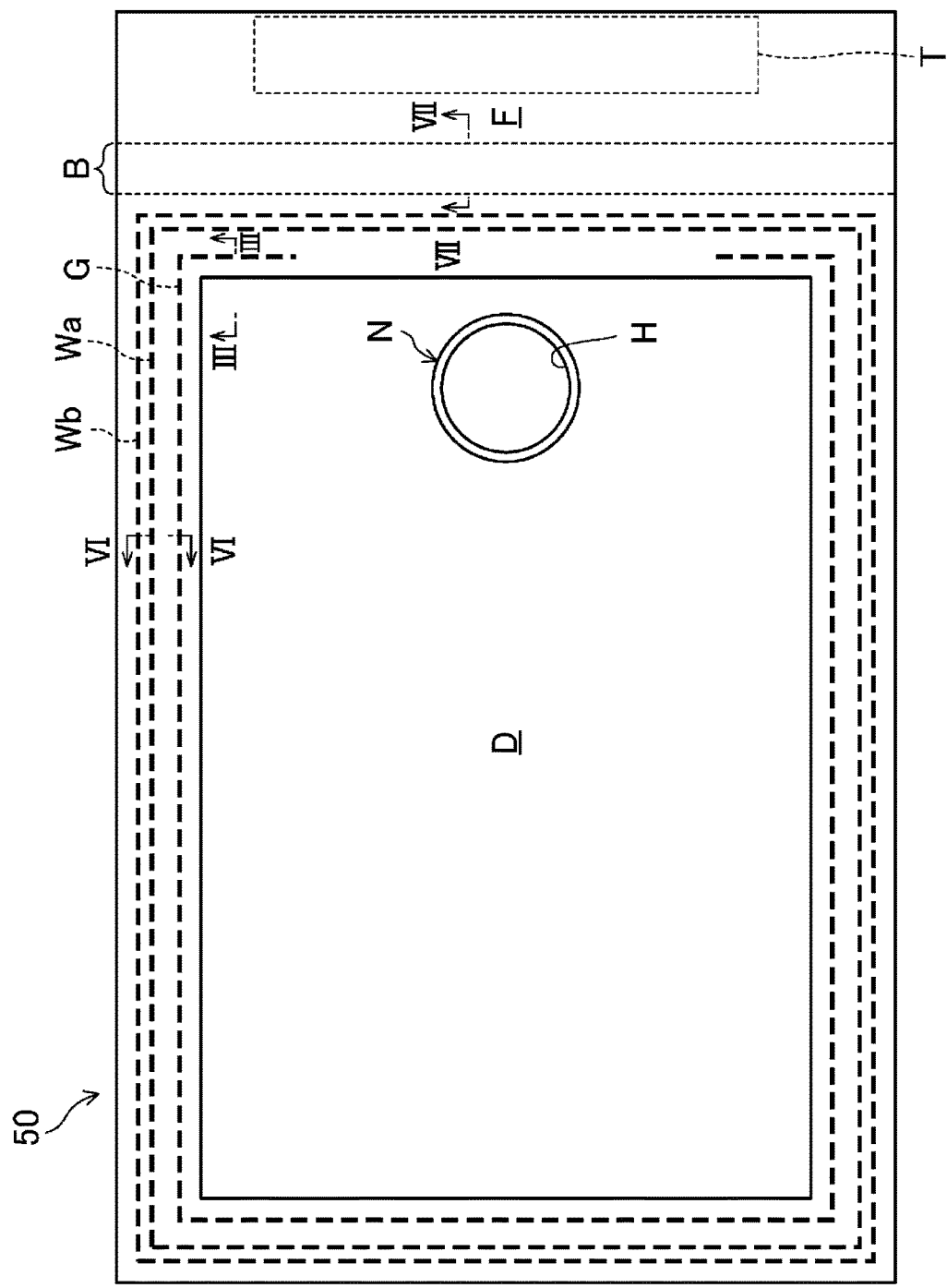
FIG. 1 is a plan view illustrating a schematic configuration of an organic EL display device according to a first embodiment of the disclosure.
Figure 2:
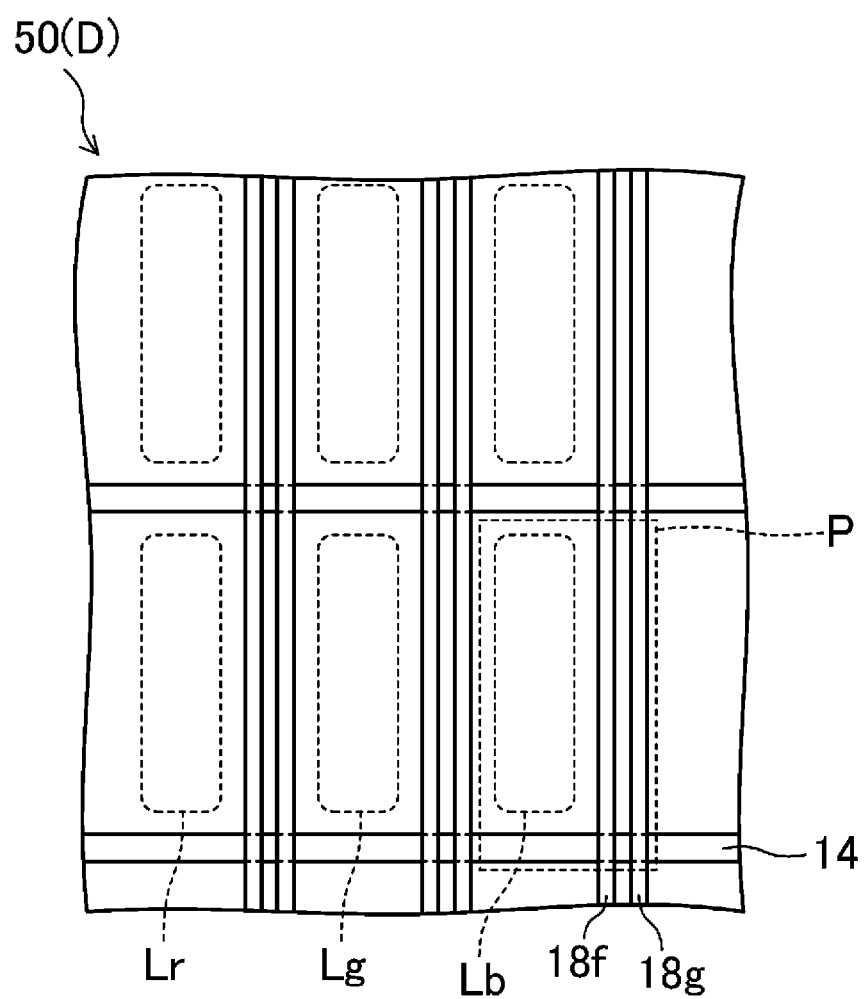
FIG. 2 is a plan view of a display region of the organic EL display device according to the first embodiment of the disclosure.
Figure 3:
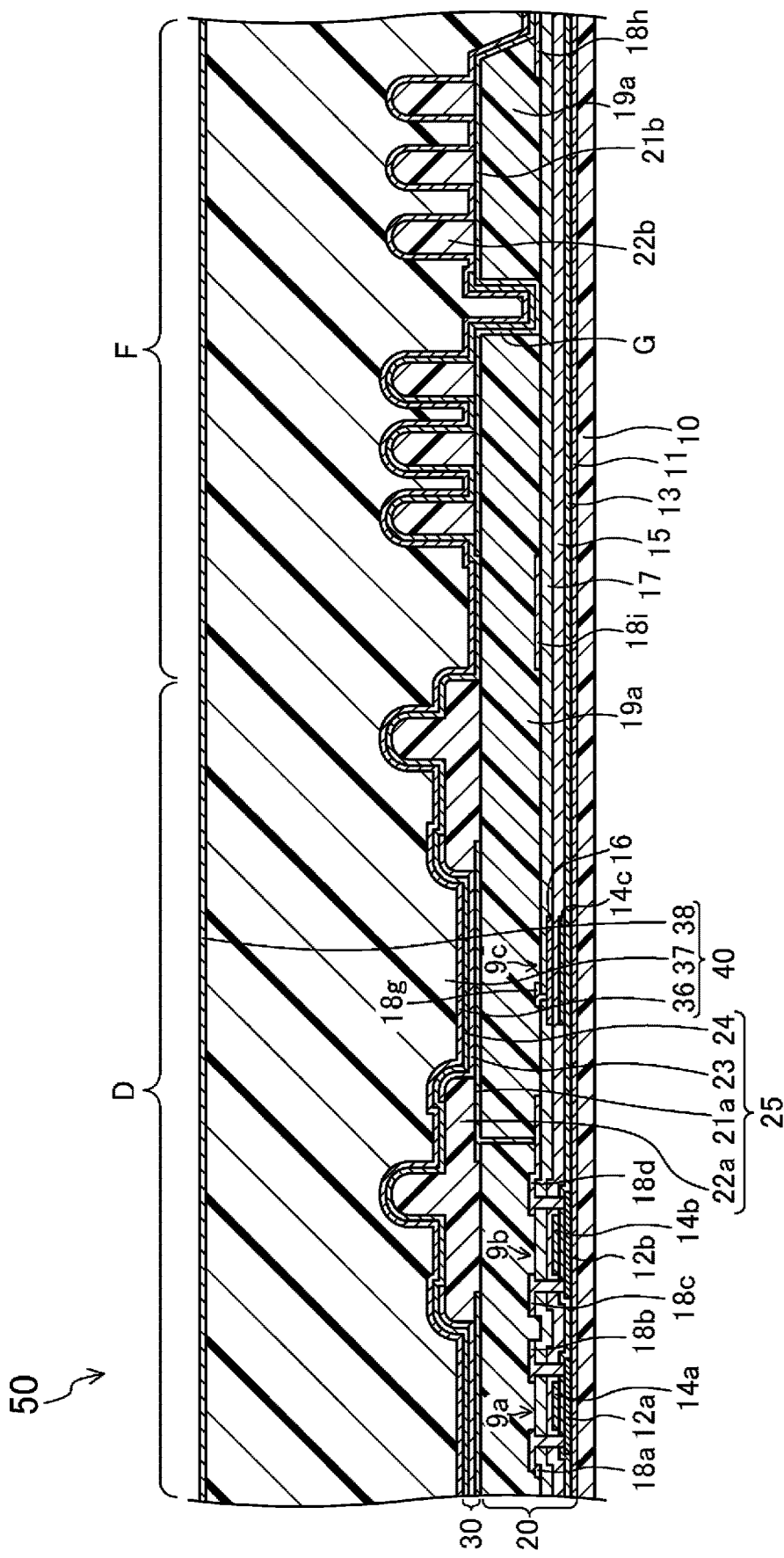
FIG. 3 is a cross-sectional view of the organic EL display device taken along a line in FIG. 1.
Figure 4:
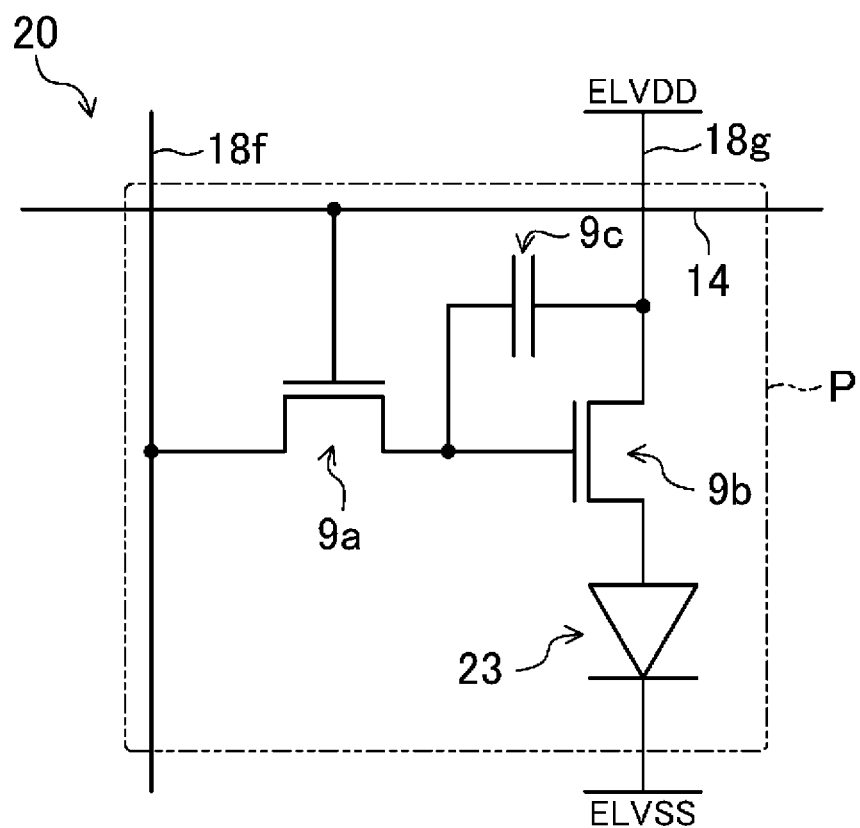
FIG. 4 is an equivalent circuit diagram of a thin film transistor layer configuring the organic EL display device according to the first embodiment of the disclosure.
Figure 5:
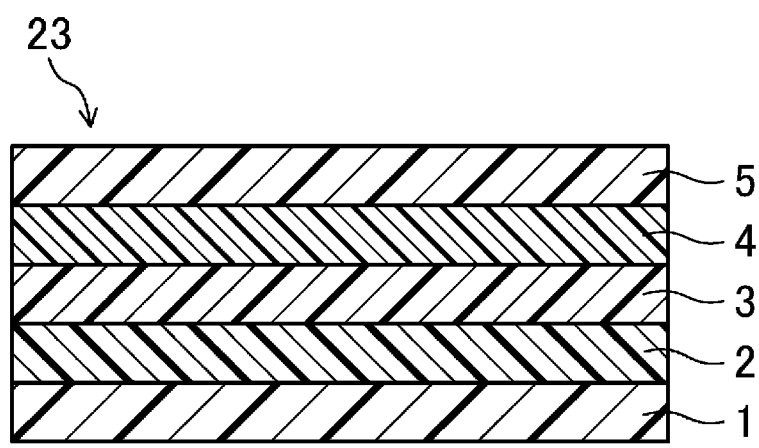
FIG. 5 is a cross-sectional view of an organic EL layer configuring the organic EL display device according to the first embodiment of the disclosure.
Figure 6:
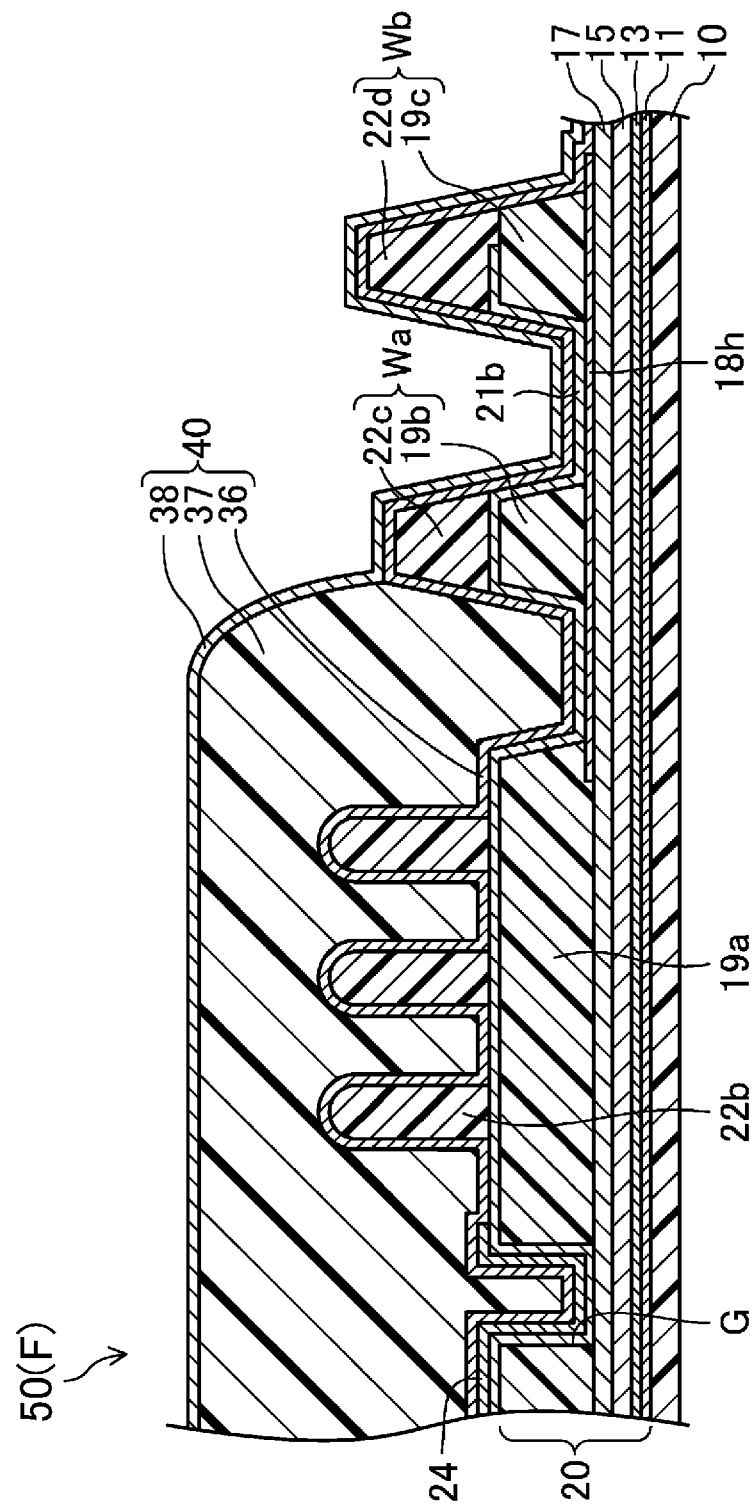
FIG. 6 is a cross-sectional view of a frame region of the organic EL display device taken along a line VI-VI in FIG. 1.
Figure 7:
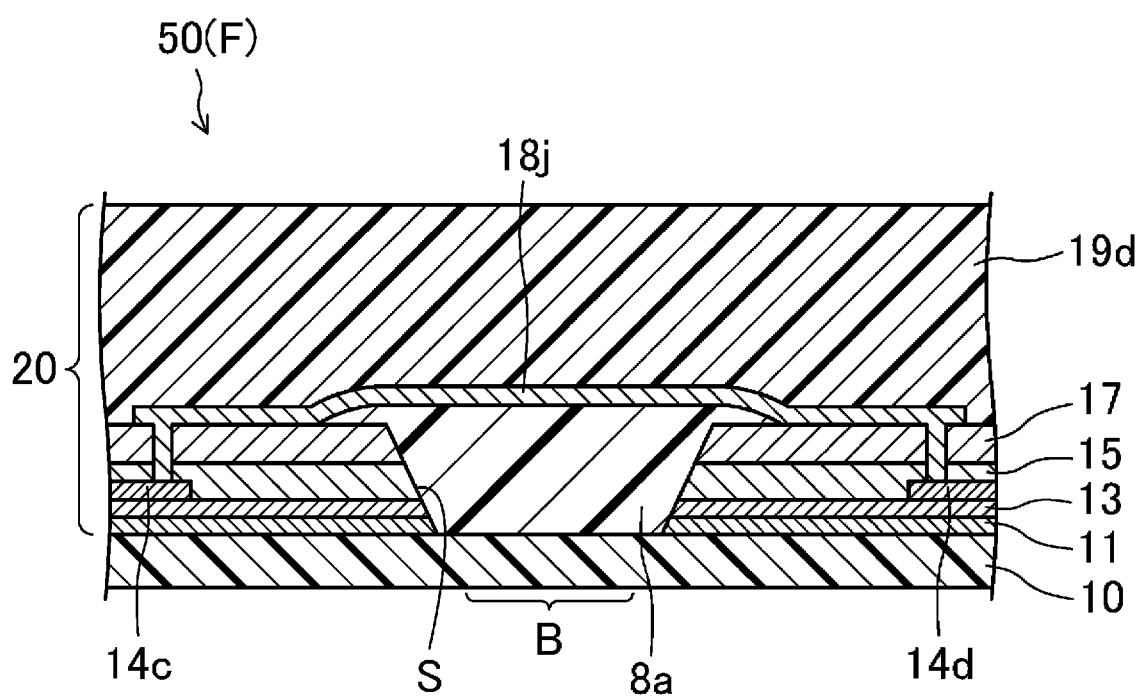
FIG. 7 is a cross-sectional view of a frame region of the organic EL display device taken along a line VII-VII in FIG. 1.
Figure 8:
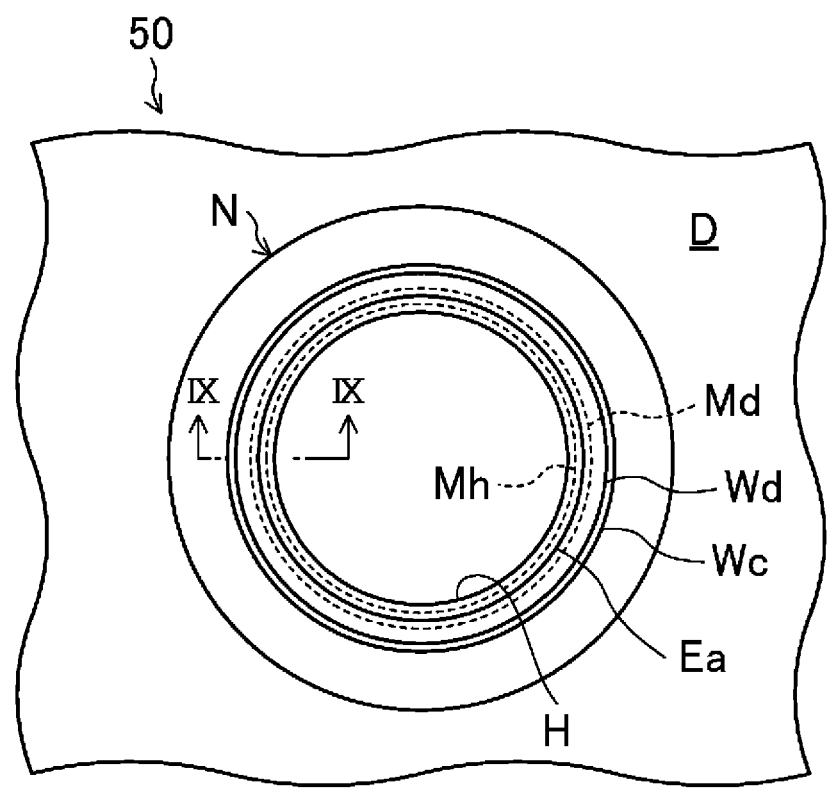
FIG. 8 is a plan view of a non-display region of the organic EL display device according to the first embodiment of the disclosure and the periphery of the non-display region.
Figure 9:
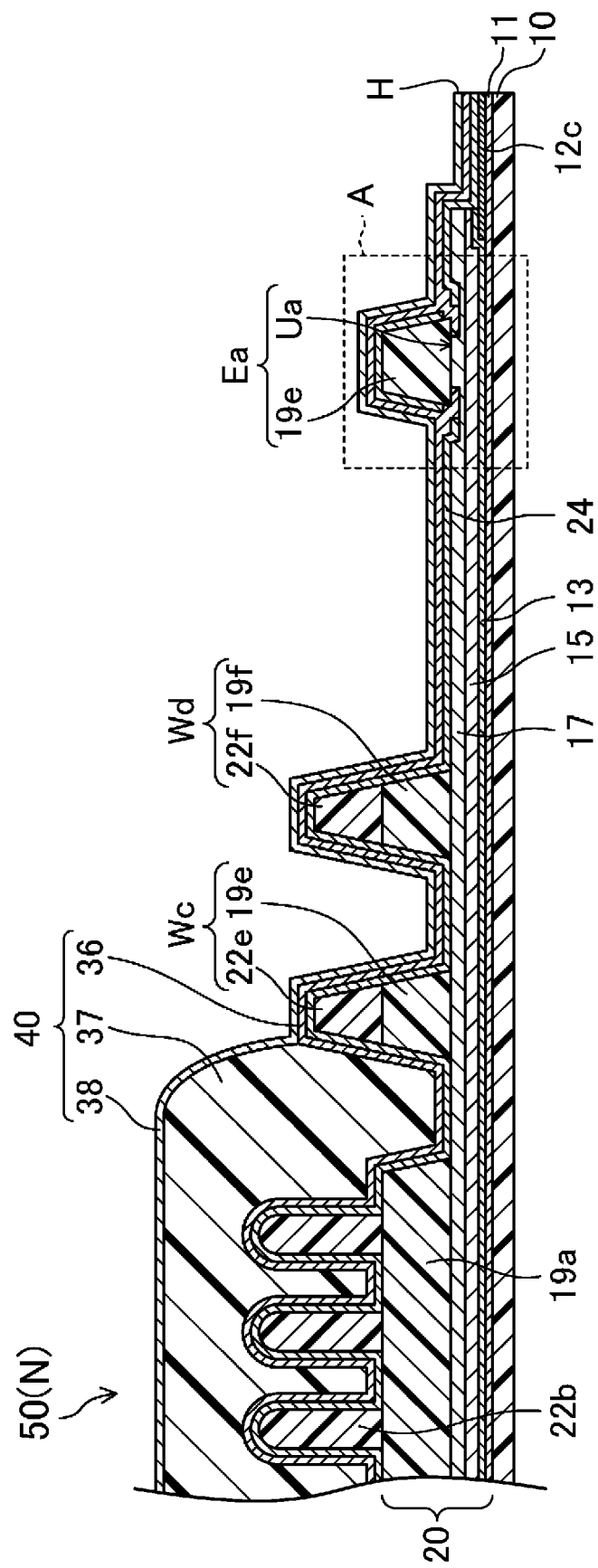
FIG. 9 is a cross-sectional view of the non-display region of the organic EL display device taken along a line IX-IX in FIG. 8.
Figure 10:
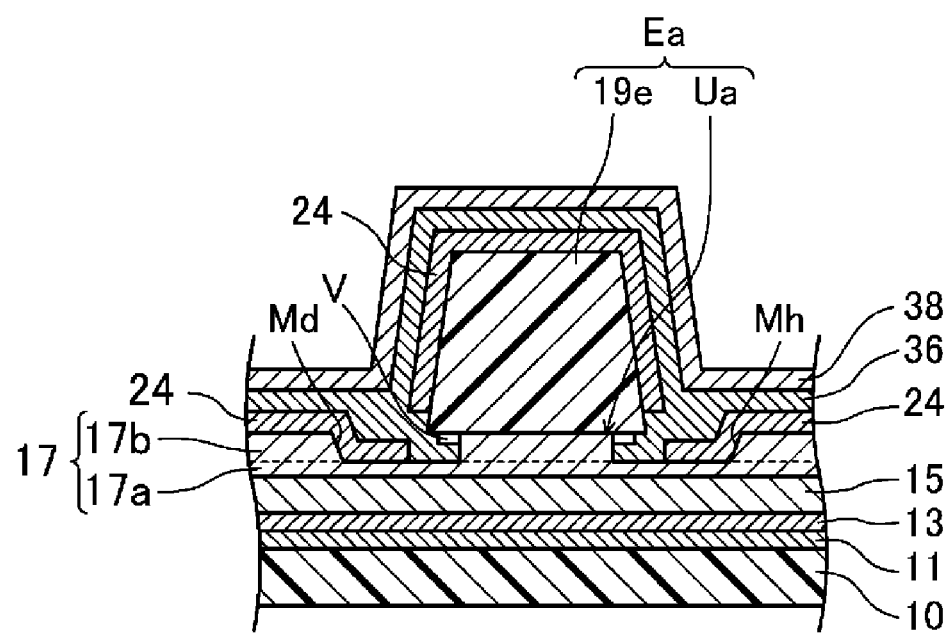
FIG. 10 is a cross-sectional view of a separation wall configuring the organic EL display device in which a region A illustrated in FIG. 9 is enlarged.

FIGS. 1 to 19 illustrate a first embodiment of a display device according to the disclosure. Note that, in each of the following embodiments, an organic EL display device including an organic EL element will be exemplified as a display device including a light-emitting element. Here, FIG. 1 is a plan view illustrating a schematic configuration of an organic EL display device 50 according to the present embodiment. In addition, FIG. 2 is a plan view of a display region D of the organic EL display device 50. FIG. 3 is a cross-sectional view of the organic EL display device 50 taken along a line in FIG. 1. FIG. 4 is an equivalent circuit diagram of a thin film transistor layer 20 constituting the organic EL display device 50. FIG. 5 is a cross-sectional view of an organic EL layer 23 configuring the organic EL display device 50. FIGS. 6 and 7 are cross-sectional views of a frame region F of the organic EL display device 50 taken along a line VI-VI and a line VII-VII in FIG. 1. FIG. 8 is a plan view of a non-display region N of the organic EL display device 50 and the periphery of the non-display region N. FIG. 9 is a cross-sectional view of the non-display region N of the organic EL display device 50 taken along a line IX-IX in FIG. 8. FIG. 10 is a cross-sectional view of a separation wall Ea configuring the organic EL display device 50 in which a region A illustrated in FIG. 9 is enlarged.

As illustrated in FIG. 1, the organic EL display device 50 includes, for example, the display region D provided in a rectangular shape and configured to display an image and a frame region F provided in a rectangular frame-like shape on the periphery of the display region D. Note that in the present embodiment, the display region D having the rectangular shape has been exemplified, but examples of the rectangular shape include a substantially rectangular shape such as a shape whose sides are arc-shaped, a shape whose corners are arc-shaped, a shape in which a part of a side has a notch and the like.

As illustrated in FIG. 2, a plurality of subpixels P are arranged in a matrix shape in the display region D. In addition, in the display region D, for example, a subpixel P including a red light-emitting region Lr configured to display a red color, a subpixel P including a green light-emitting region Lg configured to display a green color, and a subpixel P including a blue light-emitting region Lb configured to display a blue color are provided adjacent to one another, as illustrated in FIG. 2. Note that one pixel is configured by, for example, three adjacent subpixels P including the red light-emitting region Lr, the green light-emitting region Lg, and the blue light-emitting region Lb in the display region D. Further, as illustrated in FIG. 1, the non-display region N is provided in an island shape inside the display region D. Here, as illustrated in FIG. 1, in the non-display region N, a through-hole H that extends through a resin substrate layer 10 to be described below in a thickness direction is provided, for example, in order to allow a camera, a fingerprint sensor, and the like to be disposed. A detailed structure and the like of the non-display region N will be described below with reference to FIGS. 8 to 10.

A terminal portion T is provided in an end portion of the frame region F on the right side in FIG. 1 in such a manner as to extend in one direction (a vertical direction in the drawing). In addition, in the frame region F, as illustrated in FIG. 1, a bending portion B that is bendable, for example, by 180 degrees (in a U-shape) with a vertical direction in the drawing as a bending axis is provided closer to the display region D than the terminal portion T and extends in one direction (the vertical direction in the drawing). Here, in the frame region F, in a flattening film 19a to be described below, as illustrated in FIGS. 1, 3, and 6, a trench G having a substantially C shape is provided such that it extends through the flattening film 19a. Note that, as illustrated in FIG. 1, the trench G is provided in a substantially C shape such that a terminal portion T side opens in a plan view.

As illustrated in FIGS. 3, 6, 7, and 9, the organic EL display device 50 includes a resin substrate layer 10 provided as a base substrate, a thin film transistor (hereinafter, also referred to as a TFT) layer 20 disposed on the resin substrate layer 10, an organic EL element layer 30 provided on the TFT layer 20, and a sealing film 40 disposed on the organic EL element layer 30.

The resin substrate layer 10 is formed, for example, of a polyimide resin or the like.

As illustrated in FIGS. 3, 6, 7, and 9, the TFT layer 20 includes a base coat film 11, a semiconductor layer 12a (12b), a gate insulating film 13, a first metal layer, a first interlayer insulating film 15, a second metal layer, a second interlayer insulating film 17, a third metal layer, and a flattening film 19a sequentially disposed on the resin substrate layer 10. Here, the first metal layer configures a gate line 14, a gate electrode 14a (14b), and a lower conductive layer 14c, which will be described below. The second metal layer configures an upper conductive layer 16, which will be described below. The third metal layer configures a source line 18f, a power source line 18 g, a source electrode 18a (18c), a drain electrode 18b (18d), a first frame wiring line 18h, a second frame wiring line 18i, and a lead wiring line 18j to be described below. The configuration of the wiring lines described above is exemplary, and the disclosure is not limited thereto.

As illustrated in FIG. 3, the TFT layer 20 includes a plurality of first TFTs 9a, a plurality of second TFTs 9b, and a plurality of capacitors 9c provided on the base coat film 11, and a flattening film 19a provided on each of the first TFTs 9a, each of the second TFTs 9b, and each of the capacitors 9c. Here, in the TFT layer 20, as illustrated in FIG. 2 and FIG. 4, a plurality of gate lines 14 are provided so as to extend parallel to each other in the lateral direction in the drawings. Further, in the TFT layer 20, as illustrated in FIG. 2 and FIG. 4, a plurality of source lines 18f are provided so as to extend parallel to each other in the vertical direction in the drawings. Further, in the TFT layer 20, as illustrated in FIG. 2 and FIG. 4, a plurality of power source lines 18g are provided so as to extend parallel to each other in the vertical direction in the drawings. Then, as illustrated in FIG. 2, each of the power source lines 18g is provided to be adjacent to one of the source lines 18f. In the TFT layer 20, as illustrated in FIG. 4, a subpixel circuit is provided in the subpixel P corresponding to an intersection point between the gate line 14 and the source line 18f. In this subpixel circuit, the first TFT 9a, the second TFT 9b, and the capacitor 9c are provided.

The semiconductor layer 12a configuring the first TFT 9a and the semiconductor layer 12b configuring the second TFT 9b are formed using a low-temperature polysilicon film, an oxide semiconductor film, or the like.

For example, each of the base coat film 11, the gate insulating film 13, the first interlayer insulating film 15, and the second interlayer insulating film 17 is composed of a single-layer film or a layered film of an inorganic insulating film of silicon nitride, silicon oxide, silicon oxynitride, or the like. Here, the second interlayer insulating film 17 includes a lower second interlayer insulating film 17a provided on the first interlayer insulating film 15 and an upper second interlayer insulating film 17b provided on the lower second interlayer insulating film 17a. For example, the lower second interlayer insulating film 17a and the upper second interlayer insulating film 17b are composed of inorganic insulating films, which are different from each other, formed from a silicon oxide film or a silicon nitride film.

Note that in the present embodiment, the first TFT 9a and the second TFT 9b are exemplified as being of a top-gate type, but the first TFT 9a and the second TFT 9b may be a bottom-gate type TFT.

The capacitor 9c is electrically connected to the corresponding first TFT 9a and power source line 18g in each of the subpixels P, as illustrated in FIG. 4. Here, as illustrated in FIG. 3, the capacitor 9c includes a lower conductive layer 14c and the upper conductive layer 16 that are disposed to face each other via the first interlayer insulating film 15. As illustrated in FIG. 3, the upper conductive layer 16 is electrically connected to the power source line 18g via a contact hole formed in the second interlayer insulating film 17.

The flattening film 19a is, for example, formed of a positive photosensitive resin such as a polyimide resin.

As illustrated in FIG. 3, the organic EL element layer 30 includes a plurality of organic EL elements 25 provided on the flattening film 19a as a plurality of light-emitting elements arranged in a matrix pattern in correspondence with the plurality of subpixels P.

As illustrated in FIG. 3, the organic EL element 25 includes a first electrode 21a disposed on the flattening film 19a, an edge cover 22a disposed to cover a circumferential end portion of the first electrode 21, the organic EL layer 23 disposed on the first electrode 21a as a function layer, and a second electrode 24 disposed on the organic EL layer 23.

As illustrated in FIG. 3, the first electrode 21a is electrically connected to the drain electrode 18d of the second TFT 9b of each subpixel P via a contact hole formed in the flattening film 19a. The first electrode 21a functions to inject holes (positive holes) into the organic EL layer 23. The first electrode 21a is preferably formed of a material having a large work function to improve the efficiency of hole injection into the organic EL layer 23. Examples of materials constituting the first electrode 21a include metallic materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Examples of materials constituting the first electrode 21a also include an alloy such as astatine (At)/astatine oxide ($AtO_2$). Furthermore, examples of materials constituting the first electrode 21a include electrically conductive oxides such as tin oxide (SnO), zinc oxide (ZnO), indium tin oxide (ITO), and indium zinc oxide (IZO). The first electrode 21a may also be formed by layering a plurality of layers formed of any of the materials described above. Note that, examples of compound materials having a large work function include indium tin oxide (ITO) and indium zinc oxide (IZO).

The edge cover 22a is provided in a lattice shape so as to be common throughout the display region D. Examples of a material constituting the edge cover 22a include a positive photosensitive resin such as a polyimide resin, acrylic resin, polysiloxane resin, and novolak resin. Further, as illustrated in FIG. 3, part of a surface of the edge cover 22a projects upward in the drawing and is a pixel photo spacer provided in an island shape.

As illustrated in FIG. 5, each organic EL layer 23 includes a hole injection layer 1, a hole transport layer 2, a light-emitting layer 3, an electron transport layer 4, and an electron injection layer 5, which are provided in that order on a first electrode 21a.

The hole injection layer 1 is also referred to as an anode buffer layer, has a function of bringing energy levels of the first electrode 21a and the organic EL layer 23 close to each other to improve hole injection efficiency from the first electrode 21a into the organic EL layer 23, and is provided as a common function layer that is common to the plurality of subpixels P. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, stilbene derivatives, and the like. The common function layer is a function layer that is formed using a common metal mask (CMM). This CMM is a mask in which one opening is provided in correspondence with one display device, and thus a pattern that shields an area corresponding to the through-hole cannot be provided. For this reason, a common function layer is also deposited on the area corresponding to the through-hole. In contrast to this, an individual function layer is a function layer that is formed using a fine metal mask (FMM). This FMM is a mask in which an opening is provided for each color (for example, a function layer that is common to red and green is also included). Furthermore, in addition to the hole injection layer 1 described above, the function layer includes a hole transport layer 2, a light-emitting layer 3, an electron transport layer 4, an electron injection layer 5, a blocking layer, a cap layer, and the like.

The hole transport layer 2 has a function of improving the hole transport efficiency from the first electrode 21a to the organic EL layer 23 and is provided as a common function layer that is common to the plurality of subpixels P. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, zinc selenide, and the like.

The light-emitting layer 3 is provided as an individual function layer and is a region in which holes and electrons are injected from the first electrode 21a and the second electrode 24, and holes and electrons recombine together when a voltage is applied using the first electrode 21a and the second electrode 24. Here, the light-emitting layer 3 is formed of a material having high light-emitting efficiency. Moreover, examples of materials constituting the light-emitting layer 3 include metal oxynoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane, and the like.

The electron transport layer 4 has a function of efficiently moving electrons to the light-emitting layer 3 and is provided as a common function layer that is common to the plurality of subpixels P. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, metal oxynoid compounds, and the like, as organic compounds.

The electron injection layer 5 has a function of bringing energy levels of the second electrode 24 and the organic EL layer 23 close to each other to improve the efficiency of electron injection into the organic EL layer 23 from the second electrode 24, and this function allows the drive voltage of the organic EL element 25 to be lowered. The electron injection layer 5 is also referred to as a cathode buffer layer, and is provided as a common function layer that is common to the plurality of subpixels P. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), barium fluoride ($BaF_2$) and the like, aluminum oxide ($Al_2O_3$), strontium oxide (SrO), and the like.

The common function layers described above are exemplary, and any of the layers may be an individual function layer. For example, in a case where a display device is configured by performing color conversion using a quantum-dot light-emitting diode (QLED) or the like from a light-emitting layer emitting ultraviolet light or blue light, the light-emitting layer 3 may be provided as the common function layer.

As illustrated in FIG. 3, the second electrode 24 is disposed to cover each organic EL layer 23 and the edge cover 22a and is provided to be common to the plurality of subpixels P. In addition, the second electrode 24 has a function of injecting electrons into the organic EL layer 23. In addition, the second electrode 24 is preferably formed of a material with a low work function to improve the efficiency of electron injection into the organic EL layer 23. Here, examples of materials constituting the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may also be formed of alloys such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al), for example. In addition, the second electrode 24 may be formed of an electrically conductive oxide such as tin oxide (SnO), zinc oxide (ZnO), indium tin oxide (ITO), indium zinc oxide (IZO), or the like. In addition, the second electrode 24 may be formed by layering a plurality of layers formed of any of the materials described above. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al), and the like.

As illustrated in FIGS. 3, 6, and 9, the sealing film 40 includes a lower-layer sealing insulating film 36 that is disposed on the resin substrate layer 10 side to cover the second electrode 24, an upper-layer sealing insulating film 38 that is disposed on a side opposite to the resin substrate layer 10, and an organic insulating film 37 that is disposed between the lower-layer sealing insulating film 36 and the upper-layer sealing insulating film 38, and the sealing film 40 has a function of protecting the organic EL layer 23 from moisture, oxygen, and the like. Here, the lower-layer sealing insulating film 36 and the upper-layer sealing insulating film 38 are composed of an inorganic material such as silicon oxide ($SiO_2$), aluminum oxide ($Al_2O_3$), silicon nitride (SiNx (where x is a positive number)) such as trisilicon tetranitride ($Si_3N_4$), or silicon carbonitride (SiCN). Further, the organic insulating film 37 is formed of, for example, an organic material such as an acrylic resin, polyurea resin, parylene resin, polyimide resin, and polyamide resin.

Additionally, as illustrated in FIG. 1, the organic EL display device 50 includes a first external dam wall Wa that is disposed in a frame shape so as to surround the display region D and overlap with a circumferential end portion of the organic insulating film 37 in the frame region F, and a second external dam wall Wb disposed in a frame shape so as to surround the first external dam wall Wa.

As illustrated in FIG. 6, the first external dam wall Wa includes a first resin layer 19b formed of the same material as that of the flattening film 19a in the same layer and a second resin layer 22c that is disposed on the first resin layer 19b through the first conductive layer 21b and is formed of the same material as that of the edge cover 22a in the same layer. As illustrated in FIG. 6, the first conductive layer 21b is provided in a substantially C shape in such a manner as to overlap with the trench G, the first external dam wall Wa, and the second external dam wall Wb in the frame region F. Note that the first conductive layer 21b is formed of the same material and in the same layer as the first electrode 21a.

As illustrated in FIG. 6, the second external dam wall Wb includes a first resin layer 19c formed of the same material as that of the flattening film 19a in the same layer and a second resin layer 22d that is disposed on the first resin layer 19c through the first conductive layer 21b and is formed of the same material as that of the edge cover 22a in the same layer. In addition, the first external dam wall Wa and the second external dam wall Wb may be formed by one resin layer formed of the same material as that of the flattening film 19a in the same layer or one resin layer formed of the same material as that of the edge cover 22a in the same layer. For example, the first external dam wall Wa may be formed of one resin layer formed of the same material as the edge cover 22a in the same layer, and the second external dam wall Wb may be formed of two layers including the first resin layer 19c formed of the same material as that of the flattening film 19a in the same layer and the second resin layer 22d formed of the same material as that of the edge cover 22a in the same layer.

As illustrated in FIGS. 3 and 6, the organic EL display device 50 includes a first frame wiring line 18 h provided in a substantially C shape on the outer side of the trench G in such a manner as to surround the display region D and overlap with the first external dam wall Wa and the second external dam wall Wb in the frame region F. Here, the first frame wiring line 18 h is electrically connected to a power source terminal to which a low power supply voltage (ELVSS) is input in the terminal portion T. Further, as illustrated in FIG. 6, the first frame wiring line 18 h is electrically connected to the second electrode 24 via the first conductive layer 21b.

As illustrated in FIG. 3, the organic EL display device 50 includes a second frame wiring line 18i provided in a substantially C shape on the inner side of the trench G in the frame region F. Here, the second frame wiring line 18i is electrically connected to a power source terminal to which a high power supply voltage (ELVDD) is input in the terminal portion T. The second frame wiring line 18i is electrically connected, on the display region D side, to the plurality of power source lines 18g disposed in the display region D.

As illustrated in FIG. 7, the organic EL display device 50 includes a lower layer flattening film 8a provided to fill in the slit S formed in the base coat film 11, the gate insulating film 13, the first interlayer insulating film 15, and the second interlayer insulating film 17, a plurality of lead wiring lines 18j provided on the lower layer flattening film 8a and the second interlayer insulating film 17, and a wiring line covering layer 19d provided covering the plurality of lead wiring lines 18j in the bending portion B.

As illustrated in FIG. 7, the slit S is provided to be formed in a groove shape passing along a direction in which the bending portion B extends to extend through the base coat film 11, the gate insulating film 13, the first interlayer insulating film 15 and the second interlayer insulating film 17 and expose the surface of the resin substrate layer 10.

The lower layer flattening film 8a is formed of, for example, an organic resin material such as a polyimide resin.

The plurality of lead wiring lines 18j are provided extending parallel to each other in a direction orthogonal to the direction in which the bending portion B extends. Here, as illustrated in FIG. 7, both end portions of each of the lead wiring lines 18j are electrically connected to the first gate conductive layer 14c and the second gate conductive layer 14d via each contact hole formed in a layered film of the first interlayer insulating film 15 and the second interlayer insulating film 17. Note that the lead wiring lines 18j are formed of the same material as that of the source line 18f and the power source line 18g in the same layer. Further, as illustrated in FIG. 7, the first gate conductive layer 14c is provided between the gate insulating film 13 and the first interlayer insulating film 15 and is electrically connected to signal wiring lines (the gate line 14, the source line 18f, and the like) extending toward the display region D. Further, as illustrated in FIG. 7, the second gate conductive layer 14d is provided between the gate insulating film 13 and the first interlayer insulating film 15 and, for example, is electrically connected to a signal terminal of the terminal portion T. The wiring line covering layer 19d is formed of the same material as that of the flattening film 19a in the same layer.

As illustrated in FIGS. 3, 6, and 9, the organic EL display device 50 includes a plurality of peripheral photo spacers 22b each provided in an island shape so as to protrude upward in the drawing on the flattening film 19a in the frame region F and the non-display region N. Each peripheral photo spacer 22b is formed of the same material and in the same layer as the edge cover 22a. This peripheral photospacer may be formed by stacking a resin layer formed of the same material as that of the edge cover 22a in the same layer and another resin layer.

As illustrated in FIGS. 8 and 9, the organic EL display device 50 includes a separation wall Ea provided in a circular frame shape along a circumferential edge of the through-hole H in the non-display region N.

As illustrated in FIGS. 9 and 10, the separation wall Ea includes a wall base portion Ua provided in a circular frame shape by a part of the upper second interlayer insulating film 17b and a resin layer 19e provided on the wall base portion Ua in an eave shape to protrude toward the through-hole H side and the display region D side.

As illustrated in FIG. 10, the wall base portion Ua is configured by a part of the second interlayer insulating film 17 disposed between a display region side opening portion Md and a through-hole side opening portion Mh each provided in a circular frame shape in plan view on the surface of the second interlayer insulating film 17. More specifically, as illustrated in FIG. 10, the wall base portion Ua is provided on a surface of the second interlayer insulating film 17 by forming the display region side opening portion Md (see FIG. 8) and the through-hole side opening portion Mh (see FIG. 8) in a circular frame shape in plan view on the surface of the second interlayer insulating film 17. For this reason, as illustrated in FIG. 10, in the second interlayer insulating film 17, the display region side opening portion Md opening upward is provided in a circular frame shape in a plan view around the wall base portion Ua on the display region D side, and the through-hole side opening portion Mh opening upward is provided in a circular frame shape in plan view around the wall base portion Ua on the through-hole H side. More specifically, as illustrated in FIG. 10, the display region side opening portion Md and the through-hole side opening portion Mh are provided respectively to extend through the upper second interlayer insulating film 17b and expose the lower second interlayer insulating film 17a in the upper second interlayer insulating film 17b. In FIG. 8, the dashed line Md represents a circumferential edge of the display region side opening portion Md provided in the circular frame shape on the display region side, and the dashed line Mh represents a circumferential edge of the through-hole side opening portion Mh provided in the circular frame shape on the through-hole H side.

The resin layer 19e is formed of the same material as that of the flattening film 19a, which is disposed on the organic EL element layer 30 side of the TFT layer 20, in the same layer. Here, as illustrated in FIGS. 9 and 10, both side surfaces of the resin layer 19e are inclined in a forwardly tapered shape in which a width between both side surfaces gradually increases toward the resin substrate layer 10.

As illustrated in FIG. 10, in the separation wall Ea described above, the second electrode 24 (the hole injection layer 1, the hole transport layer 2, the electron transport layer 4, and the electron injection layer 5) is provided on the resin layer 19e to extend from the display region D to the through-hole H and is cut apart below circumferential ends of the through-hole H side and the display region D side of the resin layer 19e. In FIG. 10, although the hole injection layer 1, the hole transport layer 2, the electron transport layer 4, and the electron injection layer 5 are not illustrated, similar to the second electrode 24, common function layers including the hole injection layer 1, the hole transport layer 2, the electron transport layer 4, and the electron injection layer 5 are cut apart below the circumferential ends of the through-hole H side and the display region D side of the resin layer 19e. In addition, as illustrated in FIG. 10, in the display region side opening portion Md and the through-hole side opening portion Mh, the lower second interlayer insulating film 17a configuring the TFT layer 20 and the lower-layer sealing insulating film 36 configuring the sealing film 40 are in contact with each other. In addition, as illustrated in FIG. 10, in the display region side opening portion Md and the through-hole side opening portion Mh, a space V is provided surrounded by the lower-layer sealing insulating film 36, the second interlayer insulating film 17 (the upper second interlayer insulating film 17b), and the resin layer 19e.

As illustrated in FIGS. 8 and 9, the organic EL display device 50 includes a first internal dam wall Wc and a second internal dam wall Wd each provided in a circular frame shape along the periphery of the separation wall Ea on the display region D side of the separation wall Ea in the non-display region N.

As illustrated in FIG. 9, the first internal dam wall Wc includes the first resin layer 19e formed of the same material as that of the flattening film 19a in the same layer and a second resin layer 22e that is disposed on the first resin layer 19e and is formed of the same material as that of the edge cover 22a in the same layer. Here, as illustrated in FIG. 9, the first internal dam wall Wc is disposed to overlap with the circumferential end portion of the organic insulating film 37 configuring the sealing film 40 on the display region D side of the non-display region N.

As illustrated in FIG. 9, the second internal dam wall Wd includes a first resin layer 19f formed of the same material as that of the flattening film 19a in the same layer and a second resin layer 22f that is disposed on the first resin layer 19f and is formed of the same material as that of the edge cover 22a in the same layer. Here, as illustrated in FIGS. 8 and 9, the second internal dam wall Wd is disposed between the first internal dam wall Wc and the separation wall Ea in the non-display region N. In addition, the first internal dam wall Wc and the second internal dam wall Wd may be formed of one resin layer formed of the same material as that of the flattening film 19a in the same layer or one resin layer formed of the same material as that of the edge cover 22a in the same layer. For example, the first internal dam wall Wc may be formed of one resin layer formed of the same material as that of the edge cover 22a in the same layer, and the second internal dam wall Wd may be formed of two layers including a first resin layer 19f formed of the same material as the flattening film 19a in the same layer and a second resin layer 22f formed of the same material as that of the edge cover 22a in the same layer.

As illustrated in FIG. 9, the gate insulating film 13, the first interlayer insulating film 15, and the second interlayer insulating film 17 are provided so as not to reach the end surface of the through-hole H in the non-display region N. Here, as illustrated in FIG. 9, in the circumferential edge portion of the through-hole H, the semiconductor layer 12c is provided as an etch stopper to be exposed from the gate insulating film 13, the first interlayer insulating film 15, and the second interlayer insulating film 17. The semiconductor layer 12c is formed of the same material as that of the semiconductor layers 12a and 12b in the same layer. Although a configuration in which the base coat film 11 and the semiconductor layer 12c are provided as remaining on the circumferential edge portion of the through-hole H as inorganic films of the TFT layer 20 is illustrated in FIG. 9, only the base coat film 11 may remain, or a configuration in which the base coat film 11 and the semiconductor layer 12c are disposed not to reach the end face of the through-hole H, and the resin substrate layer 10 is exposed may be employed. Here, in order to suppress cracks that propagate to an inorganic film, the inorganic film may be formed to be thin at the circumferential edge portion of the through-hole H.

The organic EL display device 50 described above is configured such that, in each subpixel P, when a gate signal is input to the first TFT 9a via the gate line 14 to cause the first TFT 9a to be in the on state, a data signal is written to the gate electrode 14b of the second TFT 9b and the capacitor 9c via the source line 18f, and a current from the power source line 18g corresponding to the gate voltage of the second TFT 9b is supplied to the organic EL layer 23, the light-emitting layer 3 of the organic EL layer 23 emits light to display an image. Note that, in the organic EL display device 50, because even when the first TFT 9a is turned off, the gate voltage of the second TFT 9b is held by the capacitor 9c, the light-emitting layer 3 is kept emitting light until a gate signal of the next frame is input.

Figure 11:
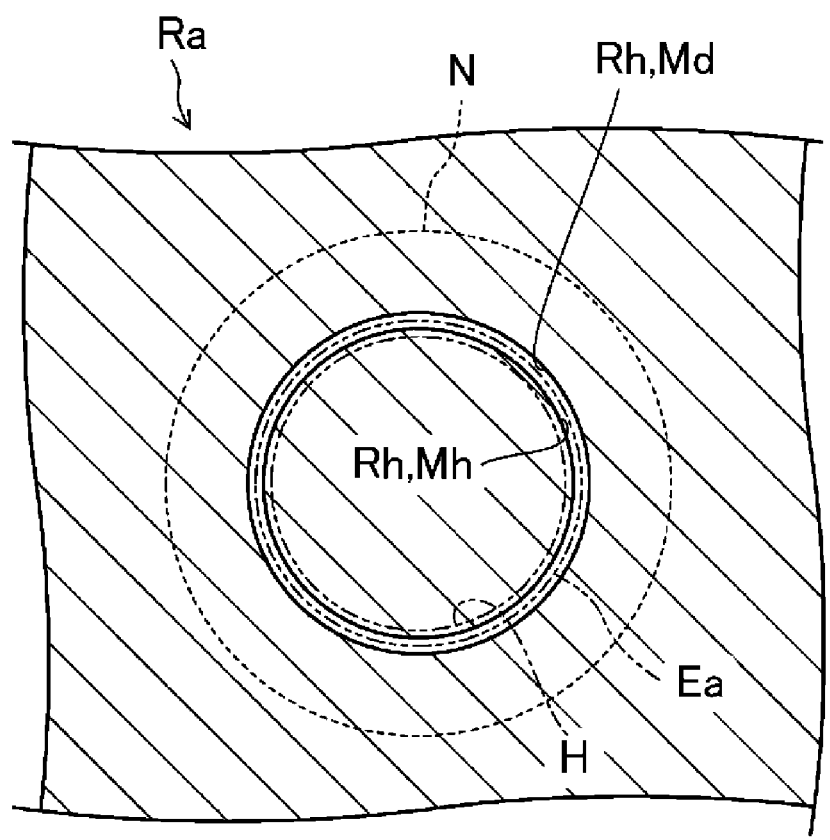
FIG. 11 is a plan view of a resist pattern used when forming the separation wall configuring the organic EL display device according to the first embodiment of the disclosure.

Next, a method for manufacturing the organic EL display device 50 according to the present embodiment will be described. Here, the method for manufacturing the organic EL display device 50 according to the present embodiment includes a TFT layer forming step, an organic EL element layer forming step, a sealing film forming step, a flexibilization step, and a through-hole forming step. FIG. 11 is a plan view of a resist pattern Ra used when forming the separation wall Ea that configures the organic EL display device 50.

TFT Layer Forming Step

For example, by using a known method, the TFT layer 20 is formed by forming the base coat film 11, the first TFT 9a, the second TFT 9b, the capacitor 9c, and the flattening film 19a on a surface of the resin substrate layer 10, which is formed on a glass substrate.

Here, when the flattening film 19a is formed on the resin substrate layer 10, the resin layer 19e is formed in a circular frame shape in the non-display region N.

Organic EL Element Layer Forming Step

The organic EL element 25 is formed by forming the first electrode 21a, the edge cover 22a, the organic EL layer 23 (the hole injection layer 1, the hole transport layer 2, the light-emitting layer 3, the electron transport layer 4, and the electron injection layer 5), and the second electrode 24 on the flattening film 19a of the TFT layer 20 formed in the TFT layer forming step described above by using a known method, whereby the organic EL element layer 30 is formed.

Here, after the edge cover 22a is formed, a protective resist formed to protect the substrate surface until the subsequent deposition step is used as the resist pattern Ra (the hatched portion in FIG. 11). In the resist pattern Ra, as illustrated in FIG. 11, a circular frame-shaped through-hole Rh is provided in the non-display region N such that the periphery on a through-hole H side and a periphery on the display region D side of the resin layer 19e are exposed. Then, by removing the upper second interlayer insulating film 17b exposed from the through-hole Rh of the resist pattern Ra using dry etching, the display region side opening portion Md and the through-hole side opening portion Mh are formed to form the wall base portion Ua. Thus, the separation wall Ea including the wall base portion Ua and the resin layer 19e is formed. Thereafter, the resist pattern Ra is peeled off, and then, the organic EL layer 23 (the hole injection layer 1, the hole transport layer 2, the light-emitting layer 3, the electron transport layer 4, and the electron injection layer 5) and the second electrode 24 are formed using a vapor deposition method. When the organic EL layer 23 and the second electrode 24 are formed using a vapor deposition method, the hole injection layer 1, the hole transport layer 2, the electron transport layer 4, and the electron injection layer 5 that configure the organic EL layer 23 and the second electrode 24 are formed by being cut apart below circumferential edges of the through-hole H side and the display region D side of the resin layer 19e according to a level difference thereof.

Sealing Film Forming Step

First, on a substrate surface in which the organic EL element layer 30 formed in the organic EL element layer forming step described above is formed, the lower-layer sealing insulating film 36 is formed, for example, by forming an inorganic insulating film such as a silicon nitride film, a silicon oxide film, a silicon oxynitride film, or the like by using a plasma chemical vapor deposition (CVD) method using a mask.

Subsequently, on the substrate surface on which the lower-layer sealing insulating film 36 is formed, an organic resin material such as an acrylic resin is formed as a film, for example, using an ink-jet method, whereby the organic insulating film 37 is formed.

Further, the upper-layer sealing insulating film 38 is formed by forming an inorganic insulating film such as a silicon nitride film, a silicon oxide film, or a silicon oxynitride film, for example, by using a plasma CVD method and using a mask on the substrate on which the organic insulating film 37 is formed, whereby the sealing film 40 is formed.

Flexibilization Step

After a protective sheet (not illustrated) is bonded to the substrate surface on which the sealing film 40 is formed through the sealing film forming step, by emitting laser light from the glass substrate side of the resin substrate layer 10, the glass substrate is peeled off from a lower face of the resin substrate layer 10, and then, a protective sheet (not illustrated) is bonded to the lower surface of the resin substrate layer 10 from which the glass substrate has been peeled off.

Through-Hole Forming Step

For example, the through-hole H is formed by emitting laser light to an area overlapping with the semiconductor layer 12c on the inner side of the separation wall Ea provided in a circular frame shape in the resin substrate layer 10 from which the glass substrate has been peeled off in the flexibilization step described above, while scanning in a circular shape.

The organic EL display device 50 of the present embodiment can be manufactured in the manner described above.

Here, in the present embodiment, although the organic EL display device 50 in which the separation wall Ea is provided in the non-display region N has been illustrated, an organic EL display device in which each of separation walls Eb to Eg is provided in place of the separation wall Ea may be used. Hereinafter, first to sixth modification examples using the separation walls Eb to Eg, respectively, will be described.

First Modification Example

Figure 12:
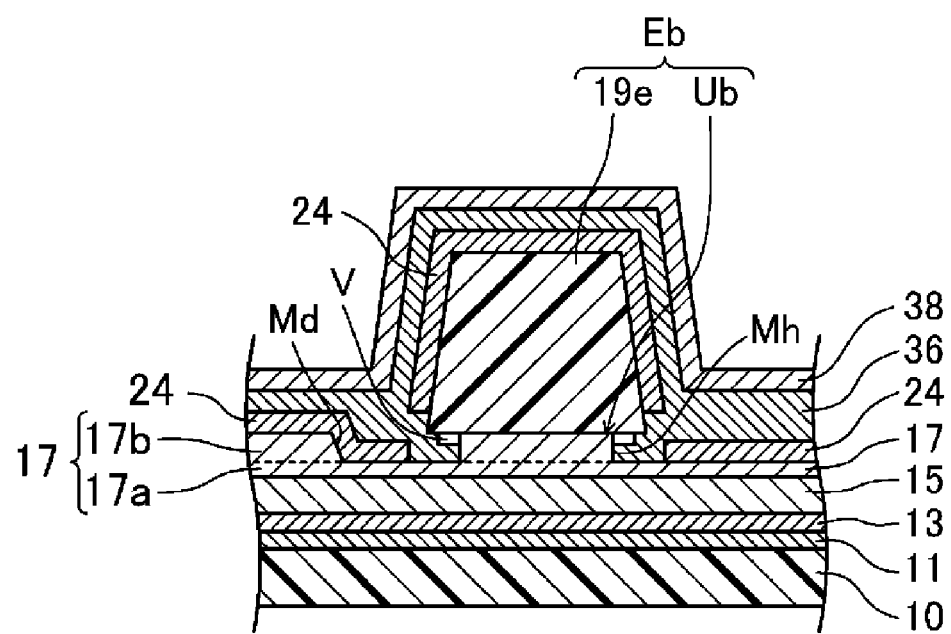
FIG. 12 is a cross-sectional view of a first modification example of the separation wall configuring the organic EL display device according to the first embodiment of the disclosure, and is a diagram corresponding to FIG. 10.
Figure 13:
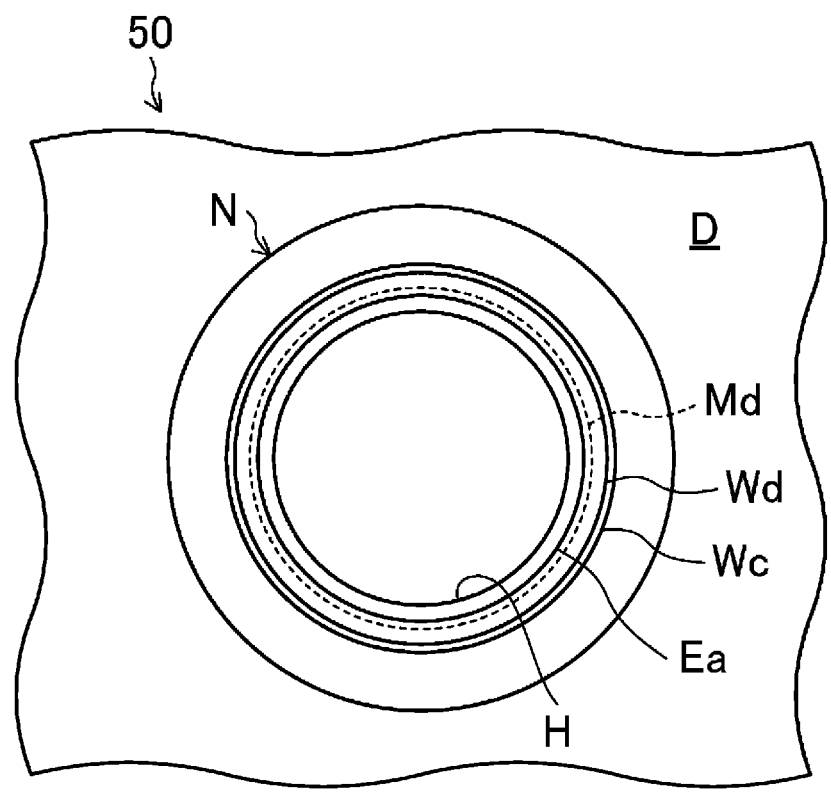
FIG. 13 is a plan view of a non-display region of the organic EL display device of the first modification example and the periphery of the non-display region, and is a diagram corresponding to FIG. 8.
Figure 14:
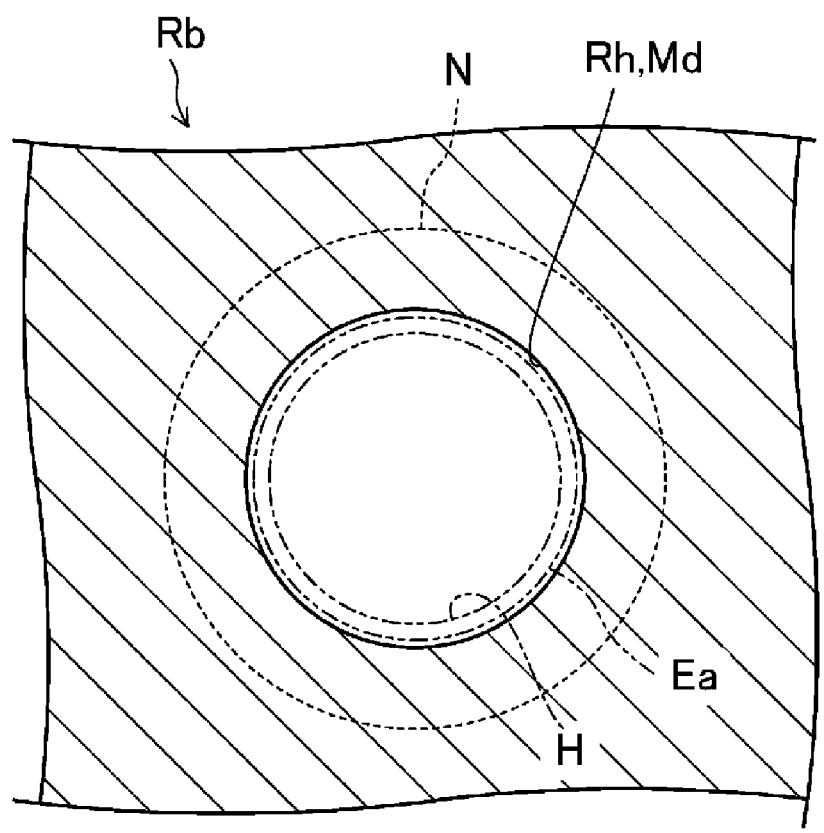
FIG. 14 is a plan view of a resist pattern used when forming the first modification example of the separation wall configuring the organic EL display device according to the first embodiment of the disclosure.

FIG. 12 is a cross-sectional view of the separation wall Eb that is a first modification example of the separation wall Ea, and is a diagram corresponding to FIG. 10. FIG. 13 is a plan view of the non-display region N and the periphery thereof of the first modification example, and is a diagram corresponding to FIG. 8. FIG. 14 is a plan view of a resist pattern Rb used when forming the separation wall Eb. In each of the following modification examples, parts identical to those in FIGS. 1 to 11 are denoted by the same reference signs, and detailed descriptions thereof will be omitted.

As illustrated in FIG. 12, the separation wall Eb includes a wall base portion Ub provided in a circular frame shape by a part of the upper second interlayer insulating film 17b and a resin layer 19e provided in an eave shape on the wall base portion Ub to protrude toward the through-hole H side and the display region D side.

As illustrated in FIG. 12, the wall base portion Ub is configured by a part of the second interlayer insulating film 17 that is disposed between the display region side opening portion Md (see FIG. 13) provided in a circular frame shape in plan view and the through-hole side opening portion Mh provided in the circular frame shape in plan view on the surface of the second interlayer insulating film 17. Here, as illustrated in FIG. 12, in the second interlayer insulating film 17, the display region side opening portion Md opening upward on the periphery of the display region D side of the wall base portion Ub is provided in a circular frame shape in plan view, and the through-hole side opening portion Mh opening upward on the periphery of the through-hole H side of the wall base portion Ua is provided in a circular frame shape in plan view. More specifically, as illustrated in FIG. 12, the display region side opening portion Md and the through-hole side opening portion Mh are provided on the upper second interlayer insulating film 17b to pass through the upper second interlayer insulating film 17b and expose the lower second interlayer insulating film 17a. Instead of using the resist pattern Ra described above, as illustrated in FIG. 13, the display region side opening portion Md and the through-hole side opening portion Mh can be formed by removing the upper second interlayer insulating film 17b exposed from the resist pattern Rb by using the resist pattern Rb (the hatched portion in the drawing) in which the through-hole Rh is provided in a circular shape in plan view such that the periphery of the through-hole H side and the periphery of the display region D side of the resin layer 19e are exposed. In accordance with this, as illustrated in FIG. 12, the through-hole side opening portion Mh is formed to reach the through-hole H. In FIG. 13, the dashed line Md represents the circumferential edge of the display region D side of the display region side opening portion Md provided in a circular frame shape, and, as described above, the through-hole side opening portion Mh is formed to reach the through-hole H, and thus there is no dashed line Mh illustrated in FIG. 8. As illustrated in FIG. 14, the display region side opening portion Md is provided to match the through-hole Rh of the resist pattern Rb.

According to the organic EL display device including the separation wall Eb having the configuration described above, the through-hole side opening portion Mh is provided to reach the through-hole H, and thus the inorganic film in a portion forming the through-hole H becomes thin and the through-hole H can be easily formed.

Second Modification Example

Figure 15:
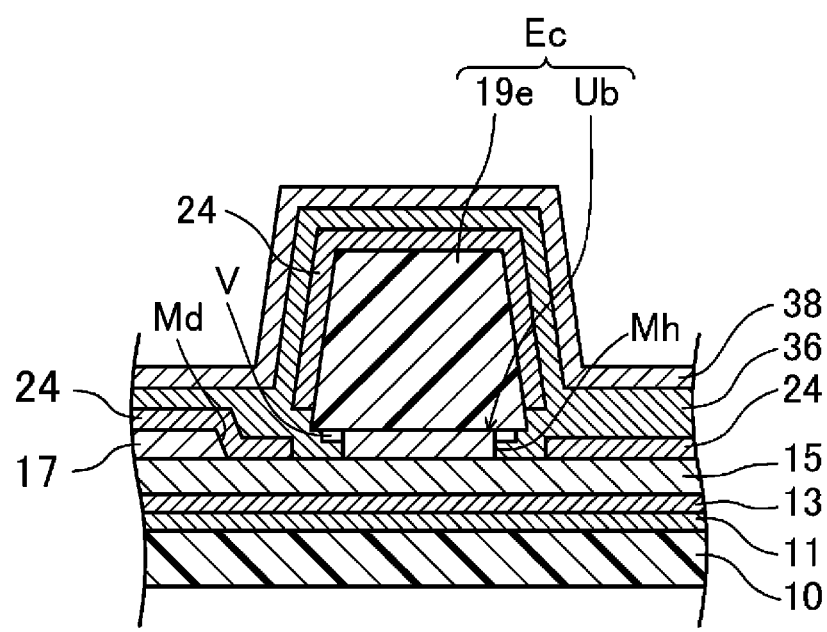
FIG. 15 is a cross-sectional view of a second modification example of the separation wall configuring the organic EL display device according to the first embodiment of the disclosure, and is a diagram corresponding to FIG. 10.

FIG. 15 is a cross-sectional view of the separation wall Ec that is a second modification example of the separation wall Ea, and is a diagram corresponding to FIG.

As illustrated in FIG. 15, the separation wall Ec includes the wall base portion Ub provided in a circular frame shape by a part of the second interlayer insulating film 17 and the resin layer 19e provided in an eave shape on the wall base portion Ub to protrude toward the through-hole H side and the display region D side.

As illustrated in FIG. 15, the display region side opening portion Md and the through-hole side opening portion Mh are provided in the second interlayer insulating film 17 to pass through the second interlayer insulating film 17 and expose the first interlayer insulating film 15. The first interlayer insulating film 15 and the second interlayer insulating film 17, for example, are formed of different inorganic insulating films, one thereof being composed of a silicon oxide film and the other being composed of a silicon nitride film. In addition, similar to the first modification example described above, the display region side opening portion Md and the through-hole side opening portion Mh can be formed by removing the exposed second interlayer insulating film 17 using the resist pattern Rb. Thus, as illustrated in FIG. 15, the through-hole side opening portion Mh is formed to reach the through-hole H.

In the display region side opening portion Md and the through-hole side opening portion Mh, as illustrated in FIG. 15, the first interlayer insulating film 15 configuring the TFT layer 20 and the lower-layer sealing insulating film 36 configuring the sealing film 40 are in contact with each other. In addition, in the display region side opening portion Md and the through-hole side opening portion Mh, as illustrated in FIG. 15, a space V is provided surrounded by the lower-layer sealing insulating film 36, the second interlayer insulating film 17, and the resin layer 19e.

According to the organic EL display device including the separation wall Eb having the configuration described above, the through-hole side opening portion Mh is provided to reach the through-hole H, and thus, the inorganic film of a portion forming the through-hole H becomes thin and the through-hole H can be easily formed.

Third Modification Example

Figure 16:
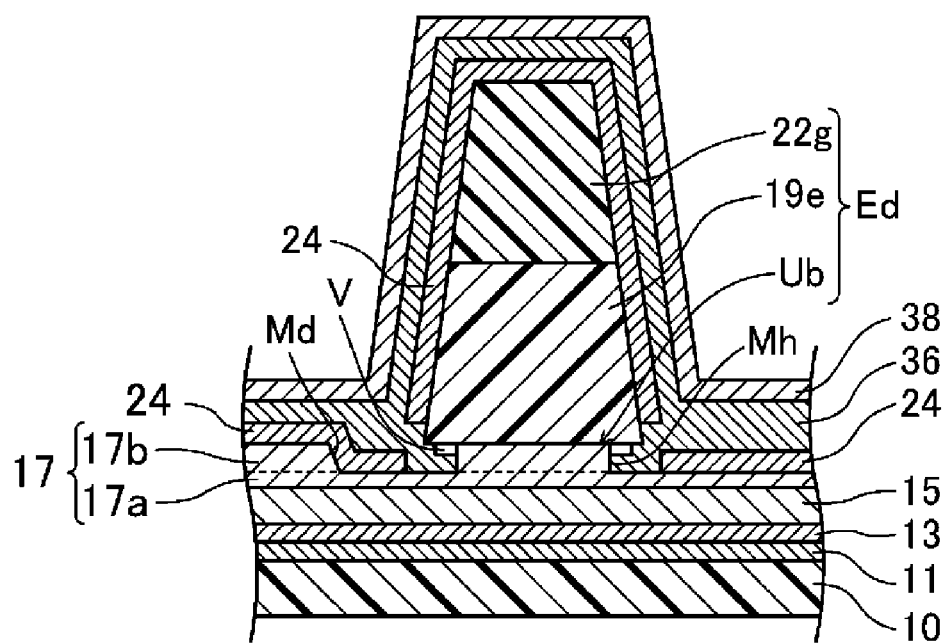
FIG. 16 is a cross-sectional view of a third modification example of the separation wall configuring the organic EL display device according to the first embodiment of the disclosure, and is a diagram corresponding to FIG. 10.

FIG. 16 is a cross-sectional view of the separation wall Ed that is a third modification example of the separation wall Ea, and is a drawing corresponding to FIG. 10.

As illustrated in FIG. 16, the separation wall Ed includes the wall base portion Ub provided in a circular frame shape by a part of the upper second interlayer insulating film 17b, a lower-layer resin layer 19e provided on the wall base portion Ub in an eave shape to protrude toward the through-hole H side and the display region D side, and an upper-layer resin layer 22g provided on the lower-layer resin layer 19e.

As illustrated in FIG. 16, the display region side opening portion Md and the through-hole side opening portion Mh are provided on the upper second interlayer insulating film 17b to pass through the upper second interlayer insulating film 17b and expose the lower second interlayer insulating film 17a. Similar to the first modification example described above, the display region side opening portion Md and the through-hole side opening portion Mh can be formed by removing the upper second interlayer insulating film 17b exposed from the resist pattern Rb by using the resist pattern Rb. Thus, as illustrated in FIG. 16, the through-hole side opening portion Mh is formed to reach the through-hole H.

The lower-layer resin layer 19e has a configuration that is substantially the same as that of the resin layer 19e described above.

The upper-layer resin layer 22g is formed of the same material as that of the edge cover 22a in the same layer. Here, as illustrated in FIG. 16, both side surfaces of the upper-layer resin layer 22g are inclined in a forward tapered shape in which a width between both side surfaces gradually increases toward the resin substrate layer 10.

In the display region side opening portion Md and the through-hole side opening portion Mh, as illustrated in FIG. 16, the lower second interlayer insulating film 17a configuring the TFT layer 20 and the lower-layer sealing insulating film 36 configuring the sealing film 40 are in contact with each other. In addition, in the display region side opening portion Md and the through-hole side opening portion Mh, as illustrated in FIG. 16, a space V is provided surrounded by the lower-layer sealing insulating film 36, the second interlayer insulating film 17 (the upper second interlayer insulating film 17b) and the lower-layer resin layer 19e.

According to the organic EL display device including the separation wall Ed having the configuration described above, the through-hole side opening portion Mh is provided to reach the through-hole H, and thus the inorganic film in a portion forming the through-hole H becomes thin and the through-hole H can be easily formed.

In addition, according to the organic EL display device including the separation wall Ed having the configuration described above, paths from the lower-layer sealing insulating film 36 and the upper-layer sealing insulating film 38 to the display region D become long, and thus propagation of cracks in the lower-layer sealing insulating film 36 and the upper-layer sealing insulating film 38 can be suppressed, whereby the separation wall Ed that improves reliability can be formed.

Fourth Modification Example

Figure 17:
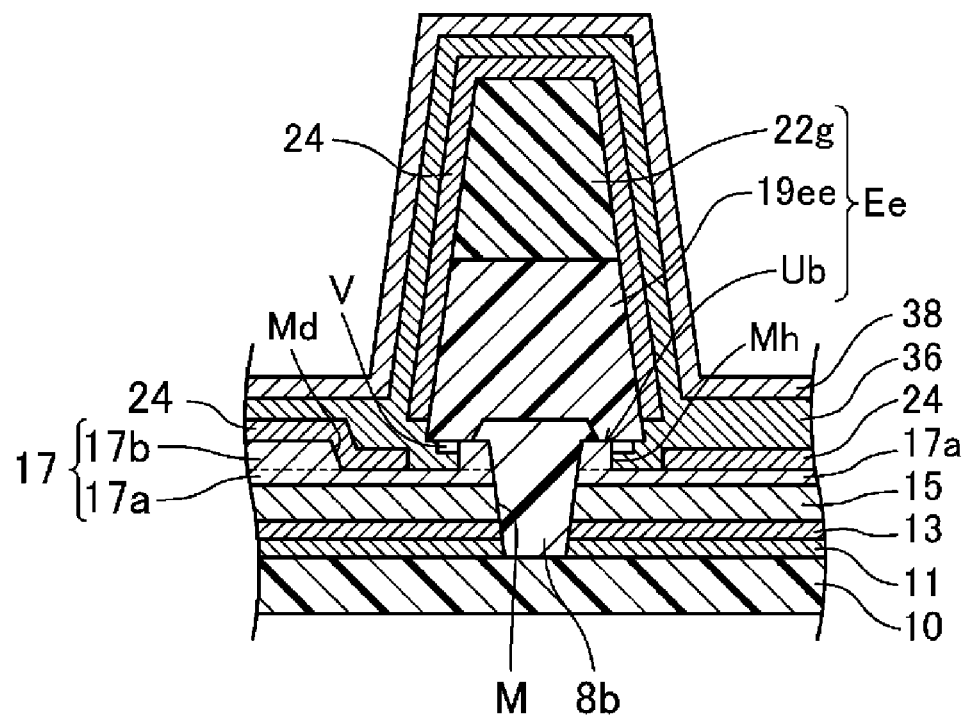
FIG. 17 is a cross-sectional view of a fourth modification example of the separation wall configuring the organic EL display device according to the first embodiment of the disclosure, and is a diagram corresponding to FIG. 10.

FIG. 17 is a cross-sectional view of the separation wall Ee that is a fourth modification example of the separation wall Ea, and is a drawing corresponding to FIG. 10.

Differences from the third modification example are in that, as illustrated in FIG. 17, a resin filling layer 8b is provided on the resin substrate layer 10 side of the separation wall Ee, and a lower-layer resin layer 19ee is provided on the resin filling layer 8b.

As illustrated in FIG. 17, the resin filling layer 8b is disposed to fill an opening portion M formed in the base coat film 11, the gate insulating film 13, the first interlayer insulating film 15, and the second interlayer insulating film 17. Here, as illustrated in FIG. 17, the opening portion M is provided in a frame shape in the base coat film 11, the gate insulating film 13, the first interlayer insulating film 15, and the second interlayer insulating film 17 to overlap with the separation wall Ee and pass through the base coat film 11, the gate insulating film 13, the first interlayer insulating film 15, and the second interlayer insulating film 17, and is formed at the same time as when the slit S of the bending portion B is formed. In addition, the resin filling layer 8b is formed of the same material as that of the lower-layer flattening film 8a, which is disposed in the bending portion B, in the same layer and is formed at the same time as when the lower-layer flattening film 8a is formed.

The lower-layer resin layer 19ee is formed of the same material as that of the flattening film 19a in the same layer.

In the display region side opening portion Md and the through-hole side opening portion Mh, as illustrated in FIG. 17, the lower second interlayer insulating film 17a configuring the TFT layer 20 and the lower-layer sealing insulating film 36 configuring the sealing film 40 are in contact with each other. In addition, in the display region side opening portion Md and the through-hole side opening portion Mh, as illustrated in FIG. 17, a space V is provided surrounded by the lower-layer sealing insulating film 36, the second interlayer insulating film 17 (the upper second interlayer insulating film 17b) and the resin layer 19ee.

According to the organic EL display device including the separation wall Ee having the configuration described above, the resin filling layer 8b is provided to fill the opening portion M formed in the base coat film 11, the gate insulating film 13, the first interlayer insulating film 15, and the second interlayer insulating film 17, and thus, even when cracks are generated in the base coat film 11, the gate insulating film 13, the first interlayer insulating film 15, and the second interlayer insulating film 17 on the through-hole H side, propagation of the cracks to the display region D side can be suppressed. In addition, since the resin filling layer 8b is provided so as to overlap with the separation wall Ee, a distance from the through-hole H to a boundary between the non-display region N and the display region D can be shortened even when a structure for suppressing the propagation of cracks is employed.

Fifth Modification Example

Figure 18:
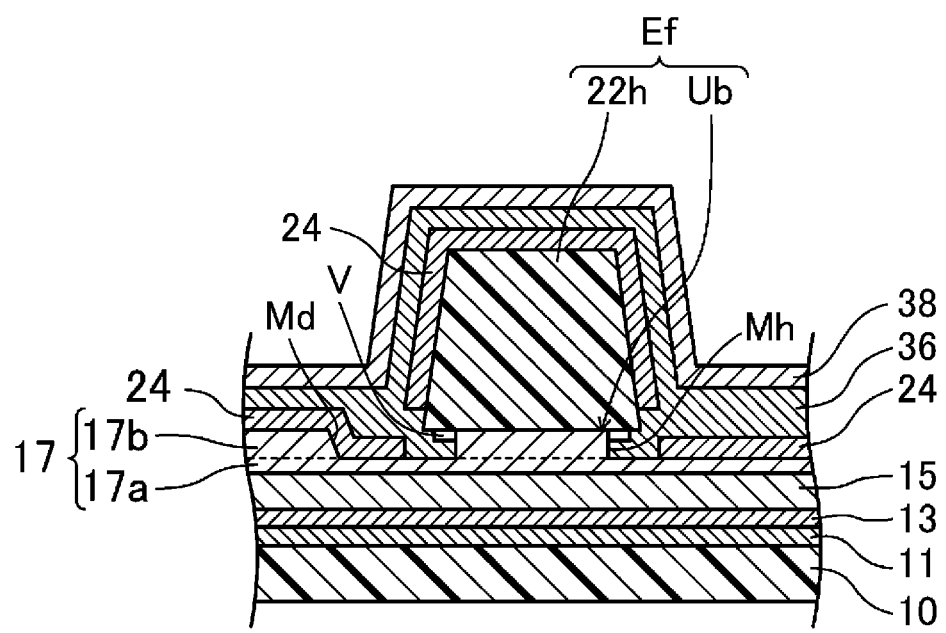
FIG. 18 is a cross-sectional view of a fifth modification example of the separation wall configuring the organic EL display device according to the first embodiment of the disclosure, and is a diagram corresponding to FIG. 10.

FIG. 18 is a cross-sectional view of the separation wall Ef that is a fifth modification example of the separation wall Ea, and is a diagram corresponding to FIG.

A difference from the first modification example described above is in that the separation wall Ef is composed of a resin layer 22 h formed of the same material as that of the edge cover 22a in the same layer. Here, as illustrated in FIG. 18, both side surfaces of the resin layer 22 h are inclined in a forwardly tapered shape in which a width between both side surfaces gradually increases toward the resin substrate layer 10.

In the display region side opening portion Md and the through-hole side opening portion Mh, as illustrated in FIG. 18, a space V is provided surrounded by the lower-layer sealing insulating film 36, the second interlayer insulating film 17 (the upper second interlayer insulating film 17b), and the resin layer 22h.

According to the organic EL display device including the separation wall Ef having the configuration described above, the through-hole side opening portion Mh is provided to reach the through-hole H, and thus the inorganic film in a portion forming the through-hole H becomes thin and the through-hole H can be easily formed.

According to the organic EL display device including the separation wall Ef having the configuration described above, the separation wall Ef improving reliability can be formed by not only using the flattening film 19a as in the present embodiment but also by using the edge cover 22a.

Sixth Modification Example

Figure 19:
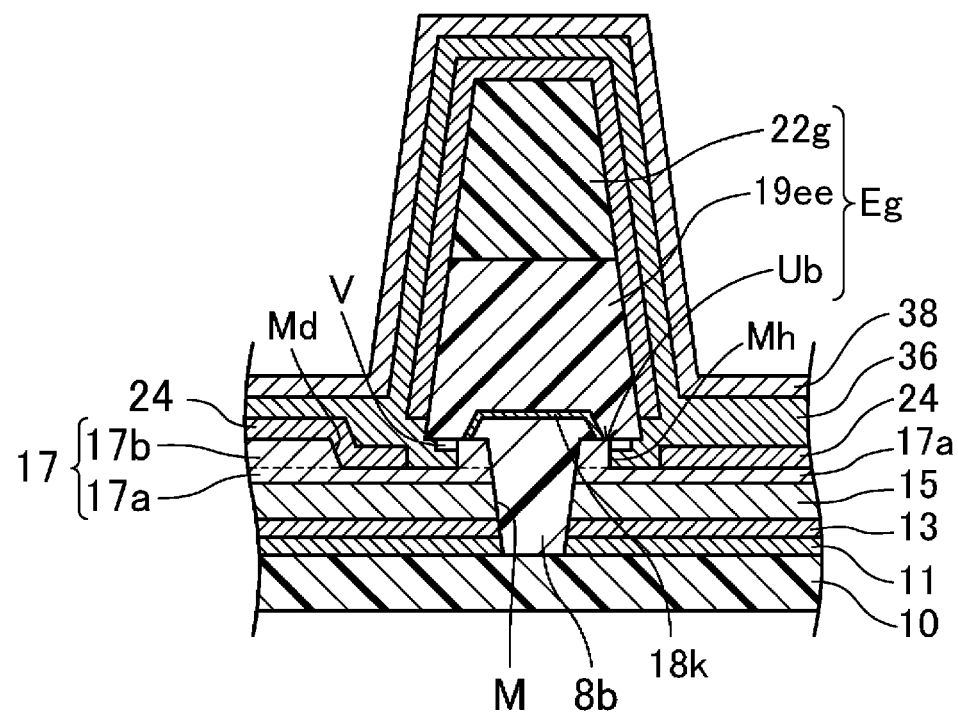
FIG. 19 is a cross-sectional view of a sixth modification example of the separation wall configuring the organic EL display device according to the first embodiment of the disclosure, and is a diagram corresponding to FIG. 10.

FIG. 19 is a cross-sectional view of the separation wall Eg that is a sixth modification example of the separation wall Ea, and is a diagram corresponding to FIG. 10.

A difference from the fourth modification example described above is in that a metal layer 18k is provided between the resin filling layer 8b and the lower-layer resin layer 19ee.

As illustrated in FIG. 19, the metal layer 18k is provided to cover a portion of the resin filling layer 8b protruding from the second interlayer insulating film 17. Here, the metal layer 18k is composed of the third metal layer described above.

According to the organic EL display device including the separation wall Eg having the configuration described above, the metal layer 18k having ductility is provided between the resin filling layer 8b and the lower-layer resin layer 19ee. Therefore, for example, on the through-hole side H, even when cracks generated in the lower-layer sealing insulating film 36 and the upper-layer sealing insulating film 38 propagate to the lower-layer resin layer 19ee, propagation of the cracks to the resin filling layer 8b can be suppressed.

In the second to sixth modification examples described above, similar to the present embodiment, the through-hole side opening portion Mh may be formed on the through-hole H side of the wall base portion Ub by performing dry etching using the resist pattern Ra in which the through-hole Rh having a circular frame shape is formed.

As described above, according to the organic EL display device 50 of the present embodiment, the separation wall Ea is provided in a frame-like shape along a peripheral edge of the through-hole H in the non-display region N which is defined to be in an island shape inside the display region D and in which the through-hole H is formed. Here, the separation wall Ea includes the wall base portion Ua provided in a frame shape by a part of the second interlayer insulating film 17 and the resin layer 19e that is provided in an eave shape on the wall base portion Ua to protrude toward the through-hole H side and the display region D side. For this reason, the common function layers and the second electrode 24 are formed to be cut apart into the display region D side and the through-hole H side below circumferential ends of the through-hole H side and the display region D side of the resin layer 19e. Then, after the edge cover 22a is formed, the wall base portion Ua is formed by forming the display region side opening portion Md and the through-hole side opening portion Mh by removing the upper second interlayer insulating film 17b exposed from the resist pattern Ra by using the protective resist for protecting the substrate surface up to the deposition step as the resist pattern Ra. Thus, the common function layers and the second electrode 24 can be formed while being separated into the display region D side and the through-hole H side without using a negative photosensitive material, and thus the common function layers and the second electrode 24 can be formed while being separated into the display region D side and the through-hole H side at low cost.

In addition, according to the organic EL display device 50 of the present embodiment, the lower second interlayer insulating film 17a of the TFT layer 20 and the lower-layer sealing insulating film 36 of the sealing film 40 are in contact with each other in the display region side opening portion Md and the through-hole side opening portion Mh, and thus sealing performance of the sealing film 40 can be secured and deterioration of the organic EL element 25 can be suppressed.

In addition, according to the organic EL display device 50 of the present embodiment, a space V is provided surrounded by the lower-layer sealing insulating film 36, the upper second interlayer insulating film 17b, and the resin layer 19e, and thus even when cracks are generated in the lower-layer sealing insulating film 36 and the upper-layer sealing insulating film 38 on the through-hole H side, propagation of the cracks to the display region D side can be suppressed.

Second Embodiment

In the first embodiment described above, while the organic EL display device 50 in which the separation wall Ea to Eg is provided in a circumferential shape along the circumferential edge of the through-hole H has been illustrated, a plurality of each of the separation walls Ea to Eg may be provided in a circumferential shape along the circumferential edge of the through-hole H. In this case, for example, the plurality of separation walls may have structures different from each other by combining the separation walls Ea to Eg.

Other Embodiments

In each of the embodiments described above, the organic EL layer having a five-layer structure including the hole injection layer, the hole transport layer, the light-emitting layer, the electron transport layer, and the electron injection layer is exemplified, but the organic EL layer may have a three-layer structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

In each of the embodiments described above, the organic EL display device in which the electrode of the TFT connected to the first electrode serves as the drain electrode is exemplified. However, the disclosure is also applicable to an organic EL display device in which the electrode of the TFT connected to the first electrode is referred to as the source electrode.

In each of the embodiments described above, the organic EL display device 50 in which the through-hole H having a circular shape in a plan view is formed is exemplified. However, for example, the through-hole H may have a polygonal shape such as a rectangular shape in a plan view.

In each of the embodiments described above, although the organic EL display device 50 including the sealing film 40 in which the organic insulating film 37 is disposed between the lower-layer sealing insulating film 36 and the upper-layer sealing insulating film 38 has been illustrated, the disclosure is also applicable to an organic EL display device in which, after an organic vapor deposition film is formed between the lower-layer sealing insulating film 36 and the upper-layer sealing insulating film 38, ashing is performed on the organic vapor deposition film and foreign matter is coated with the organic vapor deposition film. With the configuration of such a sealing film, even when foreign matter is present on the display region, sealing performance can be secured by the upper-layer sealing insulating film, and thus reliability can be improved.

In each of the embodiments described above, the organic EL display device is exemplified and described as the display device. However, the disclosure is not limited to the organic EL display device and also applicable to any display device as far as the display device has flexibility. For example, the disclosure is applicable to a flexible display device including QLEDs or the like that are light-emitting elements using a quantum dot containing layer.

INDUSTRIAL APPLICABILITY

As described above, the disclosure is useful for a flexible display device.

The invention claimed is:
1. A display device comprising:
a base substrate including a display region in which image display is performed;
a frame region disposed on a periphery of the display region;
a non-display region having an island shape inside the display region;
a thin film transistor layer including a first interlayer insulating film and a second interlayer insulating film that are disposed on the base substrate and are sequentially stacked;
a light-emitting element layer disposed on the thin film transistor layer and in which a plurality of light-emitting elements is arranged in correspondence with a plurality of subpixels configuring the display region; and
a sealing film disposed on the light-emitting element layer and including at least one layer of a sealing insulating film, wherein:
a first electrode, a function layer, and a second electrode are sequentially stacked in each of the plurality of light-emitting elements,
a through-hole extending through the base substrate in a thickness direction of the base substrate is formed in the non-display region, a separation wall is provided in a frame shape along a circumferential edge of the through-hole in the non-display region, the separation wall includes a wall base portion provided in a frame shape by a part of the second interlayer insulating film, and a resin layer provided in an eave shape on the wall base portion to protrude toward a through-hole side and a display region side, an opening portion opening upward are provided on peripheries of the wall base portion on the through-hole side and the display region side in the second interlayer insulating film, the function layer includes a common function layer that is disposed to be common to the plurality of subpixels, and the common function layer is disposed on the resin layer to extend from the display region to the through-hole and is cut apart below circumferential ends of the resin layer on the through-hole side and the display region side.

2. The display device according to claim 1,
wherein the second interlayer insulating film includes a lower second interlayer insulating film and an upper second interlayer insulating film sequentially stacked from a side of the base substrate, and
the opening portion is provided to pass through the upper second interlayer insulating film.

3. The display device according to claim 2,
wherein the lower second interlayer insulating film and the sealing insulating film are in contact with each other in the opening portion.

4. The display device according to claim 2,
wherein the lower second interlayer insulating film is composed of a silicon oxide film, and
the upper second interlayer insulating film is composed of a silicon nitride film.

5. The display device according to claim 2,
wherein the lower second interlayer insulating film is composed of a silicon nitride film, and
the upper second interlayer insulating film is composed of a silicon oxide film.

6. The display device according to claim 1,
wherein the opening portion is provided to pass through the second interlayer insulating film.

7. The display device according to claim 6,
wherein the first interlayer insulating film is exposed in the opening portion from the second interlayer insulating film, and
the first interlayer insulating film and the sealing insulating film are in contact with each other in the opening portion.

8. The display device according to claim 1,
wherein the second interlayer insulating film is composed of a silicon nitride film, and
the first interlayer insulating film is composed of a silicon oxide film.

9. The display device according to claim 1,
wherein the second interlayer insulating film is composed of a silicon oxide film, and
the first interlayer insulating film is composed of a silicon nitride film.

10. The display device according to claim 1,
wherein the thin film transistor layer further includes a flattening film disposed on a side of the light-emitting element layer, and
the resin layer is formed of the same material as the flattening film and in the same layer as the flattening film.

11. The display device according to claim 1,
wherein the light-emitting element layer includes an edge cover disposed to cover a circumferential end portion of the first electrode of each of the plurality of light-emitting elements, and
the resin layer is formed of the same material as the edge cover and in the same layer as the edge cover.

12. The display device according to claim 1,
wherein the thin film transistor layer further includes a flattening film disposed on a side of the light-emitting element layer,
the light-emitting element layer includes an edge cover disposed to cover a circumferential end portion of the first electrode of each of the plurality of light-emitting elements, and
the resin layer is provided by stacking a lower-layer resin layer formed of the same material as the flattening film and in the same layer as the flattening film, and an upper-layer resin layer formed of the same material as that of the edge cover and in the same layer as the edge cover.

13. The display device according to claim 1,
wherein an insulating film through-hole is provided in a frame shape in the second interlayer insulating film to overlap with the resin layer and pass through the second interlayer insulating film,
a resin filling layer is disposed in the insulating film through-hole to fill the insulating film through-hole, and
the resin layer is disposed on the resin filling layer.

14. The display device according to claim 13,
wherein a metal layer is provided between the resin layer and the resin filling layer.

15. The display device according to claim 1,
wherein the sealing insulating film includes a lower-layer sealing insulating film disposed on a side of the base substrate and an upper-layer sealing insulating film disposed on a side opposite the base substrate,
the sealing film further includes an organic insulating film provided between the lower-layer sealing insulating film and the upper-layer sealing insulating film, and
a frame-like dam wall is provided to overlap with a circumferential end portion of the organic insulating film along a periphery of the separation wall on the display region side of the separation wall in the non-display region.

16. The display device according to claim 15,
wherein a space is provided surrounded by the lower-layer sealing insulating film, the second interlayer insulating film, and the resin layer in the opening portion.

17. The display device according to claim 1,
wherein the opening portion on the through-hole side is provided to reach the through-hole.

18. The display device according to claim 1,
wherein each of the plurality of light-emitting elements is an organic electroluminescence element.

* * * * *